United States Patent [19]

Tanaka et al.

[11] 4,293,782
[45] Oct. 6, 1981

[54] VOLTAGE DETECTING CIRCUIT

[75] Inventors: Kojiro Tanaka; Shozo Ochiai; Hideki Noda, all of Tokyo, Japan

[73] Assignee: Kabushiki Kaisha Daini Seikosha, Tokyo, Japan

[21] Appl. No.: 763,598

[22] Filed: Jan. 28, 1977

[30] Foreign Application Priority Data

Jan. 28, 1976 [JP] Japan ................... 51/8237

[51] Int. Cl.³ ........................... H03K 5/153
[52] U.S. Cl. ................... 307/350; 307/304; 307/310
[58] Field of Search ........... 307/304, 350, 362, 363, 307/310

[56] References Cited

U.S. PATENT DOCUMENTS 3,628,070 12/1971 Heuner et al. ............... 307/304
3,917,960 11/1975 Kane ........................ 307/238
3,949,545 4/1976 Chihara .................... 307/350 X Primary Examiner—John Zazworsky
Attorney, Agent, or Firm—Robert E. Burns; Emmanuel J. Lobato; Bruce L. Adams

[57] ABSTRACT

A voltage detecting circuit, for example for detecting the approaching exhaustion of the battery of a timepiece, hand-held calculator or other small electronic device uses a MOS transistor, the operating point of which in detecting the predetermined voltage is selected as the point at which the ratio of the current to the conductive constant of the MOS transistor is above 0.1. The temperature compensation thereby achieved is good enough that the measured value almost coincides with the design value without the need of using a variable resistor.

3 Claims, 12 Drawing Figures

VOLTAGE DETECTING CIRCUIT

FIELD OF INVENTION

The present invention relates to a voltage detecting circuit and in particular to a circuit for detecting a predetermined drop in the voltage of a battery used in an electronic timepiece, hand-held calculator or other small electronic device in order to indicate that the battery is approaching exhaustion and should be replaced.

BACKGROUND OF INVENTION

Voltage detecting circuits are known which use a voltage divider and an inverter comprising a MOS transistor and which detect a predetermined voltage with the inverted output signal of the inverter. However, such voltage detecting circuits are characterized by the operating point of the MOS transistor in detecting the predetermined voltage, being selected as a point at which the ratio of current to the conductive constant of the MOS transistor is low for example less than 0.01. With a voltage detecting circuit of this kind, it is necessary to use a variable resistor for adjustment and even with such resistor, the temperature compensation of the detecting circuit is poor.

SUMMARY OF INVENTION

It is an object of the present invention to provide a voltage detecting circuit which overcomes the disadvantages and insufficiencies of prior circuits and in particular, greatly improves the temperature characteristics. Moreover, the characteristics of the voltage detecting circuit are such that it is not necessary to employ a variable resistor for adjustment.

In accordance with the present invention, a voltage detecting circuit using a voltage divider and an inverter comprising an MOS transistor is characterized by the operating point of the MOS transistor at which the predetermined voltage is detected being selected as a point in which the ratio of current to the conductive constant of the MOS transistor is above 0.1. Although higher current is used, an increase in the overall power dissipation is avoided by controlling the voltage detecting circuit by a pulse signal so that the higher current flow is only momentary.

BRIEF DESCRIPTION OF DRAWINGS

The nature, objects and advantages of the invention and the features which distinguish the invention from the prior art will be more fully understood from the following description in connection with the accompanying drawings in which.

DESCRIPTION OF PRIOR ART

Figure 1:
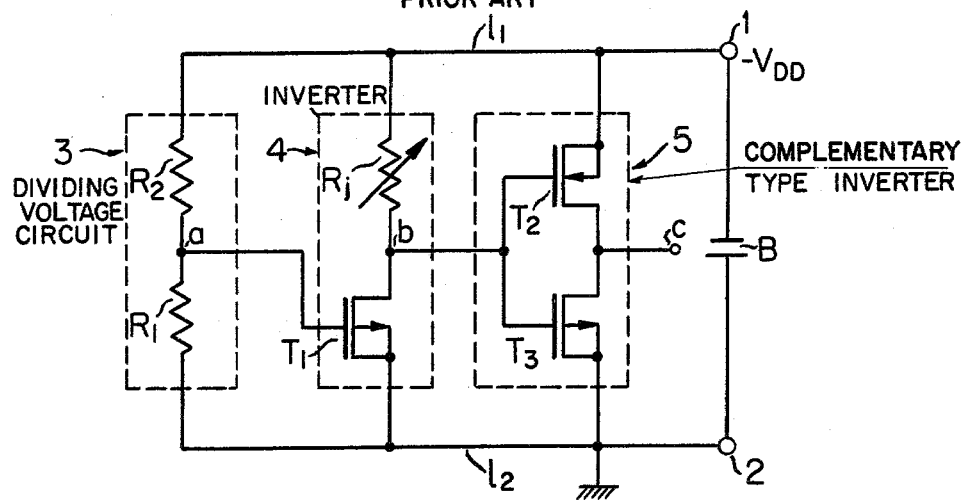
FIG. 1 is a circuit diagram showing a conventional voltage detecting circuit comprsing a voltage divider and two inverters.

Referring to the concept of a conventional voltage detecting circuit using an MOS transistor as shown in FIG. 1, the power source of which the output voltage is to be detected is connected by terminals 1 and 2 respectively to lead lines $l_1$ and $l_2$.

When the lead line $l_2$ is grounded and has a voltage level of "0", the power source terminal comes to have a voltage level of "$-V_{DD}$" if a battery B having an electromotive force of $V_{DD}$ is connected between the power source terminal 1 and the power source terminal 2.

Between the lead line $l_1$ and the lead line $l_2$, there is connected a voltage dividing circuit 3 comprising resistors $R_1$ and $R_2$ which are connected in series with one another with an intermediate tap a between them. An inverter 4 comprising a P channel MOS transistor (hereinafter called P-MOS) $T_1$ in series with a variable resistor $R_j$ as a load is connected between the lead line $l_1$ and the lead line $l_2$ and the gate of the P-MOS $T_1$ is connected to the intermediate tap a of the voltage dividing circuit 3. A complementary type inverter 5 comprising an N channel MOS transistor (hereinafter called N-MOS) $T_2$ and a P-channel MOS transistor (hereinafter called P-MOS) $T_3$ is connected between the lead line $l_1$ and the lead line $l_2$. The gates of both of the MOS transistors are connected to a point b between the MOS transistor and variable resistor of the inverter 4. The drains of the N-MOS transistor $T_2$ and the P-MOS transistor $T_3$ are connected to an output terminal c.

The output signal of the voltage divider circuit 3 is applied to the inverter 4 of which the output signal is provided to the complementary type inverter 5 whereby the detected output signnal of the voltage detecting circuit is produced from the complementary type inverter 5.

Figure 2:
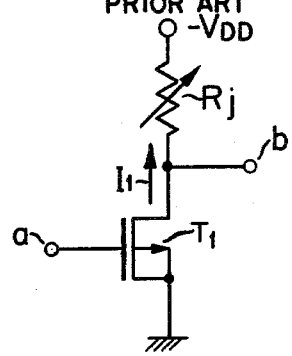
FIG. 2 is a circuit diagram of one of the inverters of FIG. 1.

Next, the inverter 4 of FIG. 1 is shown in FIG. 2. The voltage level $V_a$ between the output point a of the voltage dividing circuit 3 and the lead line $l_2$ is represented by the following equation:

$$V_a = V_{DD}(R_1/R_1 + R_2)$$

And also, assuming that the current flowing through the resistor $R_j$ is $I_1$, the voltage level $V_b$ between the output point b of the inverter 4 and the lead line l₂ is represented by the following equation:

$$V_b = V_{DD} - R_j \times I_1$$

The above current $I_1$ is represented by the following equation, assuming that the threshold voltage of the P-MOS $T_1$ is $V_p$ and the conductive constant is $K_1$, if $V_a - V_p < V_b$;

$$I_1 = K_1(V_a - V_p)^2$$

Accordingly, the output voltage $V_b$ of the inverter 4 is represented by the following equation:

$$V_b = V_{DD} - R_j K_1 (V_a - V_p)^2$$

The "conductive constant" of an MOS transistor, as the term is herein used, is expressed by the equation:

$$K = \frac{\mu \epsilon_{Ox} \epsilon_o W}{2 t_{Ox} L}$$

where $\mu$ is mobility, $\epsilon_{0x}$ is the dielectric constant of the silicon dioxide layer, $\epsilon_o$ is the dielectric constant of free space, W is the width of the gate, $t_{0x}$ is the thickness of the insulating silicon dioxide layer of the MOS transistor and L is the length of the channel.

Figure 3:
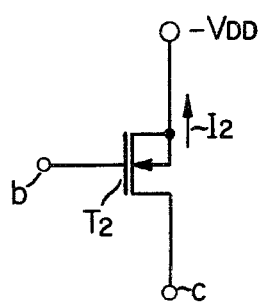
FIG. 3 shows a N-MOS transistor of the second inverter shown in FIG. 1.

The gate of the N-MOS $T_2$ used in the complementary inverter 5 is connected to the point b of the voltage $V_b$ as shown in FIG. 1 and FIG. 3. The source and substrate of the N-MOS $T_2$ are connected to the power source terminal 1 of the voltage $-V_{DD}$ and further the drain is connected to the point c.

Figure 4:
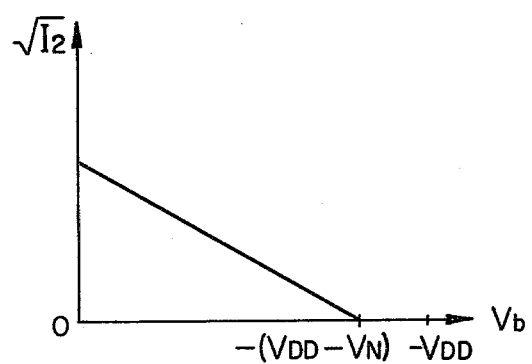
FIG. 4 is a graph showing the relation between the gate voltage and the current in the N-MOS transistor of FIG. 3.

Assuming that the N-MOS $T_2$ saturates, the current $I_2$ is represented by the following equation:

$$I_2 = K_2(V_{DD} - V_b - V_N)^2$$

where $K_2$ is the conductive constant of the N-MOS $T_2$ and $V_N$ is the threshold voltage thereof. As understood from this equation, the relation between the current $I_2$ flowing into the N-MOS $T_2$ and the voltage of the point b is shown in FIG. 4.

Figure 5:
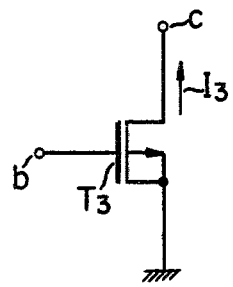
FIG. 5 shows a P-MOS transistor of the second inverter shown in FIG. 1.

Also, the gate of the P-MOS $T_3$ is connected to the point b of the voltage $V_b$ and the drain thereof is connected to the point c having the voltage level $V_c$ as shown in FIG. 1 and FIG. 5. The substrate and source of the P-MOS $T_3$ are grounded.

Assuming now that the P-MOS $T_3$ saturates, the current $I_3$ of the P-MOS $T_3$ is represented by the following equation:

$$I_3 = K_3(V_b - V_p)^2$$

where $K_3$ is the conductive constant of the P-MOS $T_3$ and $V_p$ is the threshold voltage thereof. As understood from this equation, the relation between the current $I_3$ flowing into the P-MOS $T_3$ and the voltage level $V_b$ of the point b is shown in FIG. 6.

Figure 6:
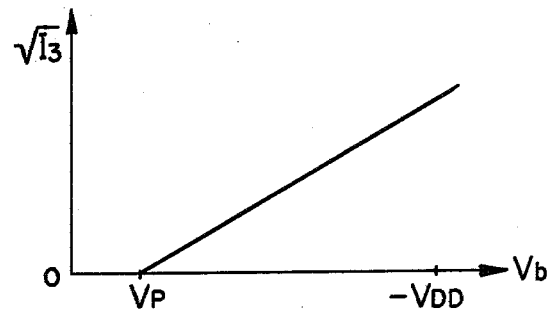
FIG. 6 is a graph showing the relation between the gate voltage and the current in the P-MOS transistor of FIG. 5.
Figure 7:
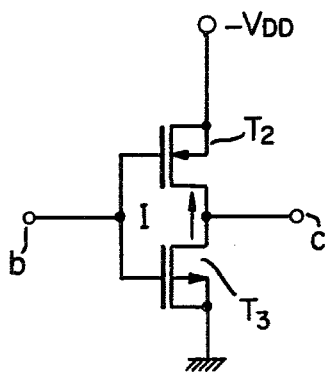
FIG. 7 shows a complementary type inverter which is the second-mentioned inverter shown in FIG. 1.
Figure 8:
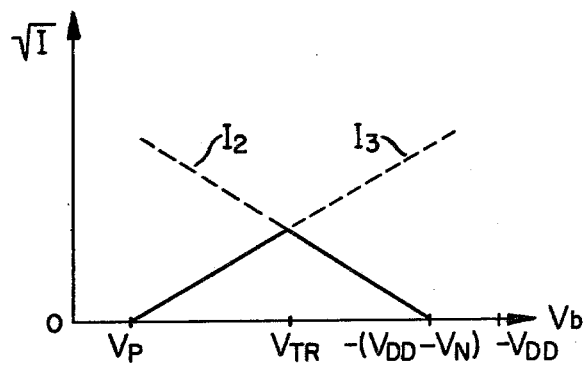
FIG. 8 is a graph showing the relation between the gate voltage and the current in the inverter of FIG. 7.

As understood from FIG. 4 and FIG. 6, in the complementary type inverter 5 comprising the N-MOS $T_2$ and the P-MOS $T_3$, the relation between the current I flowing into the circuit and the voltage $V_b$ of the point b is shown in FIG. 8. Assuming that the gate voltage level $V_b$ is equal to $V_{TR}$ when the relation between the currents $I_2$ flowing into the N-MOS $T_2$ and the current $I_3$ flowing into the P-MOS $T_3$ is $I_2 = I_3$, $$K_2(V_{DD} - V_{TR} - V_N)^2 = K_3(V_{TR} - V_p)^2.$$

From this equation, $$V_{TR} = \left\{ \sqrt{K_3} \, V_p + \sqrt{K_2} \, (V_{DD} - V_N) \right\} / \left( \sqrt{K_2} + \sqrt{K_3} \right)$$

In the case that the voltage between the point b and the lead line l₂ is higher than the voltage level $V_{TR}$ which is the gate voltage, being the voltage between $I_2 < I_3$, the output signal obtained from the point c of the complementary type inverter 5 comes to be almost the voltage level of the power source terminal 2 depending on the current $I_3$ flowing into the P-MOS $T_3$.

In the case that the voltage between the point b and the lead line l₂ is lower than $V_{TR}$ the output signal comes to be almost the voltage level of the power source 1. Thus, $V_{TR}$ is the inverting voltage by which the complementary type inverter 5 is inverted.

As mentioned above, the voltage detecting circuit as shown in FIG. 1 comes to detect the predetermined voltage since the output signal of the complementary type inverter 5 is inverted when the voltage of the battery B drops to a predetermined voltage. In the equation representing the above $V_a$, assuming that $\alpha$ is the dividing ratio $R_1/R_1 + R_2$ of the voltage dividing circuit 3, $V_a$ is represented by the following equation:

$$V_a = \alpha \cdot V_{DD}$$

If this equation is inserted into the equation representing $V_b$, $$V_b = V_{DD} - R_j K_1 (\alpha \cdot V_{DD} - V_p)^2.$$

And also, assuming that the ratio of $\sqrt{K_2}$ to $\sqrt{K_3}$, namely $$\frac{\sqrt{K_2}}{\sqrt{K_3}}$$

is equal to t, $V_{TR}$ is written by the following equation:

$$V_{TR} = \{V_p + t(V_D - V_N)\}/1 + t$$

And further, assuming that $V_j$ is the detecting voltage which is the value of the voltage level inverted by the inverter 5 when $V_b = V_{TR}'$ $$V_j - R_j K_1(\alpha \cdot V_j - V_p)^2 = \{V_p + t(V_j - V_N)\}/(1 + t)$$

And the detecting voltage $V_j$ is a function of $\alpha$, $R_j$, $K_1 t$, $V_N$, and $V_p$. Namely, $V_j = F(\alpha, R_j, K_1, t, V_N, V_p)$ assuming that the ratio t of conductive coefficients in the transistors of the inverter 5 is determined at about 0.001 so that the conventional voltage detecting circuit does not dissipate power, $V_{TR}$ is able to determine at the threshold voltage $V_p$ of the P-MOS $T_3$ in the complementary type inverter 5.

Accordingly, from the relation of $V_{TR} \approx V_p$, $V_p = V_j - R_j K(\alpha \cdot V_j - V_p)^2$. From the above equation, the detecting voltage $V_j$ is determined.

Namely, the conventional voltage detecting circuit determines the operating point thereof so that the ratio t of the current I flowing into the MOS transistor to the conductive constant K, namely, $I/K_3$ becomes a low value. For example, $I/K_3$ is set to be the relation of $t \leq 0.01$ as shown in FIG. 9.

Figure 9:
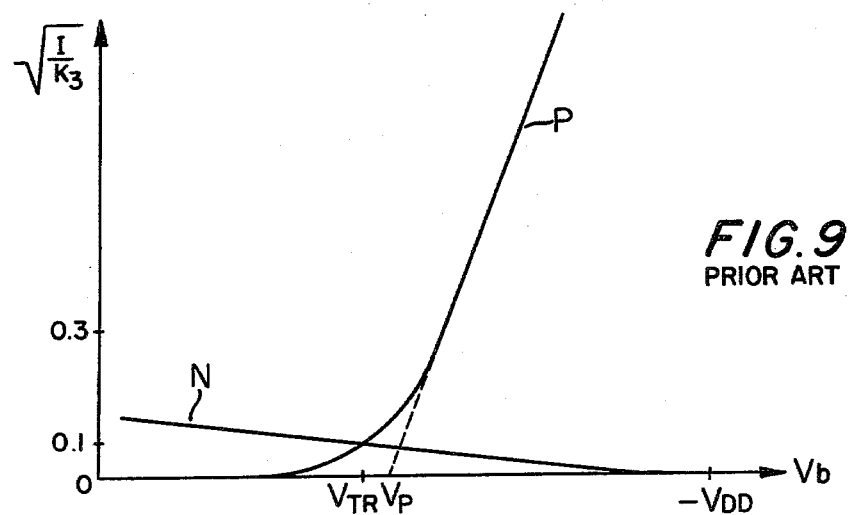
FIG. 9 is a graph showing the ratio between the conductive constant and the current of the MOS transistor to the gate voltage of the MOS transistor for explaining the operation of the complementary type inverter.

In FIG. 9, the curve P represents the relation between the gate voltage $V_G$ of the P-MOS $T_3$ and $\sqrt{I/I_3}$ and the curve N represents the relation between the gate voltage $V_D$ of the N-MOS $T_2$ and $\sqrt{I/K_3}$.

In view of the curve P, $\sqrt{I/K_3}$ to $V_D$ varies linearly when $\sqrt{I/K_3}$ exists at the high region and also $\sqrt{I/K}$ to $V_D$ does not vary linearly when $\sqrt{I/K_3}$ exists at the low region. Accordingly, initially, it is supposed that $V_p$ is equal to $V_{TR}$ approximately assuming that $\sqrt{I/K_3}$ to $V_b$ varies linearly. However, practically speaking, $V_{TR}$ is in the value lower than $V_p$ by 0.1–0.2.

As mentioned above, the conventional voltage detecting circuit which sets the operating point of the MOS in the low region of I/K, when the battery is detected, is constructed to detect a predetermined voltage by adjusting the variable resistor $R_j$ since the detected voltage is different from the predetermined voltage. And also, in the case that $I/K_3$ is greater, the temperature characteristic is the feature of reappearance. In the case that $I/K_3$ is in the lower region, the temperature characteristic has not the feature of reappearance since the fabricating process varies.

Accordingly, even if the resistor $R_j$ is adjusted variably in the conventional voltage detecting circuit, the changing ratio of $V_j$ to the temperature T cannot be the value of O, namely $\delta V_j/\delta T = 0$. Accordingly, it is a disadvantage that the above described conventional voltage detecting circuit cannot detect precisely and exactly the predetermined voltage in the broad temperature range.

DESCRIPTION OF PREFERRED EMBODIMENTS

The object of this invention is to provide a new voltage detecting circuit which selects the operating point in the higher region of I/K when the voltage detecting circuit detects, which is able to make to temperature compensation, and which is able to set the detected voltage at a predetermined value without adjusting a variable resistor.

Figure 10:
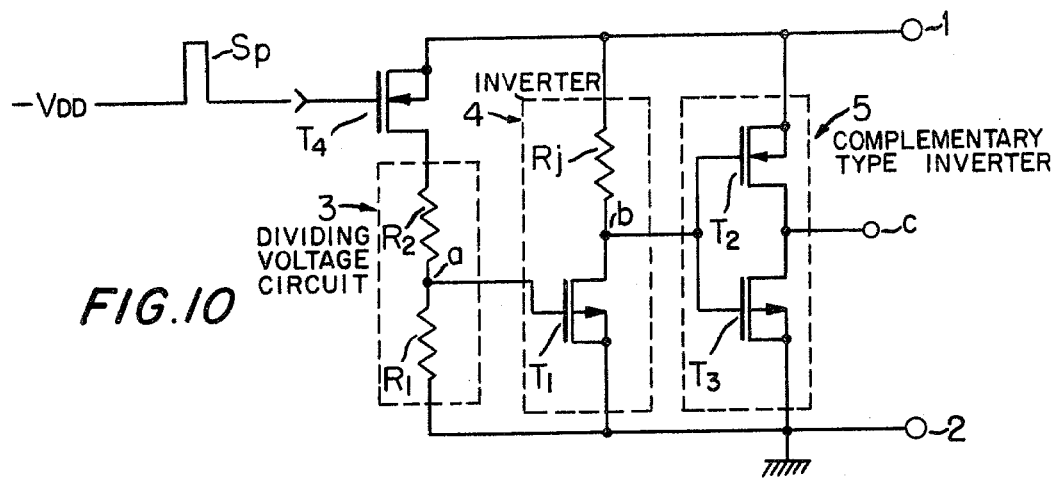
FIG. 10 is a circuit diagram showing an embodiment of the voltage detecting circuit according to the present invention.

Referring now to the detailed description of the embodiments illustrated in the drawing, FIG. 10 is a circuit diagram showing an embodiment of the voltage detecting circuit according to the invention.

The fundamental circuit construction is similar to the conventional voltage detecting circuit as shown in FIG. 1. The different point between the conventional voltage detecting circuit and the voltage detecting circuit according to this invention is the operating point of the MOS transistor when the voltage detecting circuit detects.

Accordingly, the respective circuit elements ae identified by the same reference numerals as the corresponding circuit elements shown in FIG. 1.

In FIG 10, $T_4$ is an N channel MOS transistor connected between the power source terminal 1 and the voltage dividing circuit 3. The gate electrode of the N channel MOS transistor $T_4$ receives the sampling pluse SP at the detecting time.

The sampling pulse SP is obtained from the dividing circuit dividing the oscillating frequency of the quartz crystal oscillating circuit for the electronic timepiece and the time counter for the electronic timepiece. This sampling pulse SP comes to be higher than the $-V_{DD}$ level state at the predetermined time width.

And the MOS transistor $T_4$ comes to be at the state of the high voltage level of the sampling pulse SP whereby the current flows into the dividing voltage circuit 3. At this time, the voltage detecting circuit has the detecting function.

The conventional voltage detecting circuit uses as the operating point, a point in the lower region of I/K as mentioned above. However, the voltage detecting circuit of the present invention uses as the operating point, a point in the higher region where I/K to $V_b$ of the MOS trasistor varies linearly and has a higher value.

From the following equation, namely, $V_j - R_j \cdot K_1(\alpha \cdot V_j - V_p)^2 = \{V_p + t(V_j - V_N)\}/(1+t)$, the constants of the respective elements depending on the detected voltage $V_j$ are determined.

The relation between the threshold voltage $V_{TH}$ of the P-MOS $T_1$, N-MOS $T_2$, P-MOS $T_3$ and the conductive constant K is represented by the following Table.

TABLE 1

|  | $V_{TH}$ | K |
|---|---|---|
| $T_1$ | 0.776V | 3.26uA/V² |
| $T_2$ | 0.310V | 36.5uA/V² |
| $T_3$ | 0.776V | 100.3uA/V² |

The threshold voltages $V_p$, $V_N$ and the conductive constant K have the characteristic of reappearance in the temperature characteristic since the operating point is selected in the higher region of I/K.

According to the experiment concerning $K_p$ of the P-MOS, $$1/K_p \cdot \delta K_p/\delta T = 0.71\%/°C.$$

and also, concerning $K_N$ of the N-MOS, $$1/K_N \cdot \delta K_N/\delta T = -0.51\%/°C.$$

and further, concerning to the threshold voltage $\delta V_p/\delta T = 1.4$ mV/°C. and $\delta V_N/\delta T = 1.7$ mV/°C.

The detecting voltage $V_j$ including the temperature coefficient is written by the following equation approximately:

$$V_j = 1/\alpha \cdot \left( V_p + \frac{1}{R_j K_1} \right)$$

and from the equation of $\delta V_j/\delta T = 0$, $1/R_j \cdot K_1 \times 0.71\% = 1.4$ mV $1/R_j \cdot K_1 \approx 200$ mV On the other hand, $$V_p = 0.776 \text{ V} \quad V_p + 1/R_j \cdot K_1 \approx 0.976 \text{ mV}$$

In the case that the respective constants of $\alpha$, t, $K_1$, and $R_j$ are determined so that $V_j/T \leq 100$ mV/"C. and the detect voltage $V_j$ is 1.35 V, at first $I/K = 1$, $K_1 = 3.26$ and next $t = \sqrt{36.5/100.3}$ and last and $R_1$ are determined.

Assuming now that $V_j = 1.35$ V,
$1.35 = 1/\alpha \ (0.976)$
$\alpha \approx 0.7$
$\alpha = R_1/(R_1+R_2) \approx 0.7$.
Accordingly, $R_1:R_2 \approx 7:3$.
However, if $\alpha$ value is computed exactly, $\alpha = 6/7$.

As mentioned above, the temperature coefficient of the MOS transistor has the characteristic of reappearance with the operating point thereof in the higher region of I/K. And, also, the temperature-compensation of the detecting voltage $V_j$ is achieved. And the relation between $V_b$ of the MOS transistor and $\sqrt{I/K}$ is a linear relation of which the point is the operating point in detecting the voltage. Accordingly, the designed value of the detected voltage coincides with the practical measured value.

Figure 11:
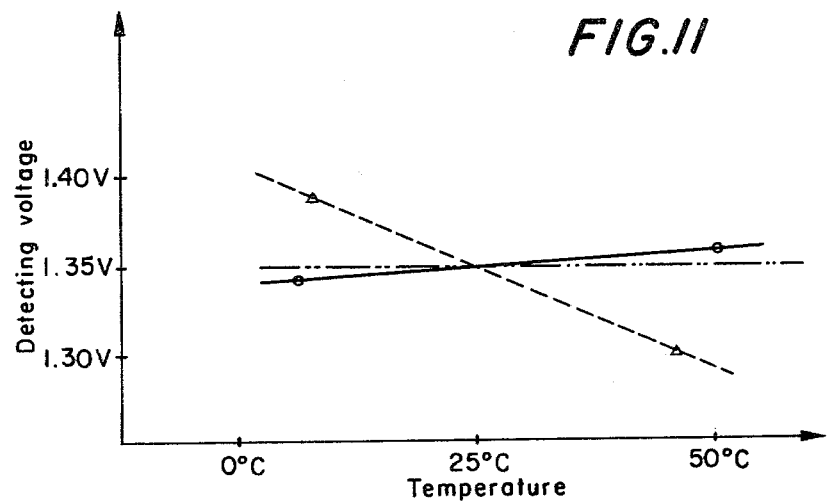
FIG. 11 is a graph showing the relation of the detecting voltage to the temperature of the voltage detecting circuit according to the present invention and according to a conventional voltage detecting circuit and FIG. 12 is a circuit diagram showing another voltage detecting circuit in accordance with the present invention.

FIG. 11 shows the relation between the voltage detecting circuit according to this invention and the conventional voltage detecting circuit selecting the operating point in the lower region of I/K. In FIG. 11, the curve shown by the two point dotted line is the designed value, the curve shown by the solid line is the practical measured value according to this invention and the curve shown by the dotted line is the practical measured value of the conventional voltage detecting circuit.

As understood from FIG. 11, according to the voltage detecting circuit of the invention, the temperature-compensation is made good enough that the designed value almost coincides with the practical measured value and also the design is made simple and further the resistor $R_j$ may be a fixed resistor.

Accordingly, the adjustment of the variable resistor used in the conventional voltage detecting circuit is not needed.

Also, the practical dissipation power of the voltage detecting circuit according to this invention is able to be the same as that of the conventional voltage detecting circuit by sampling the voltage measuring time by the sampling pulse, although the voltage detecting circuit momentarily dissipates greater power by selecting the operating point in the higher region of 1/K.

Figure 12:
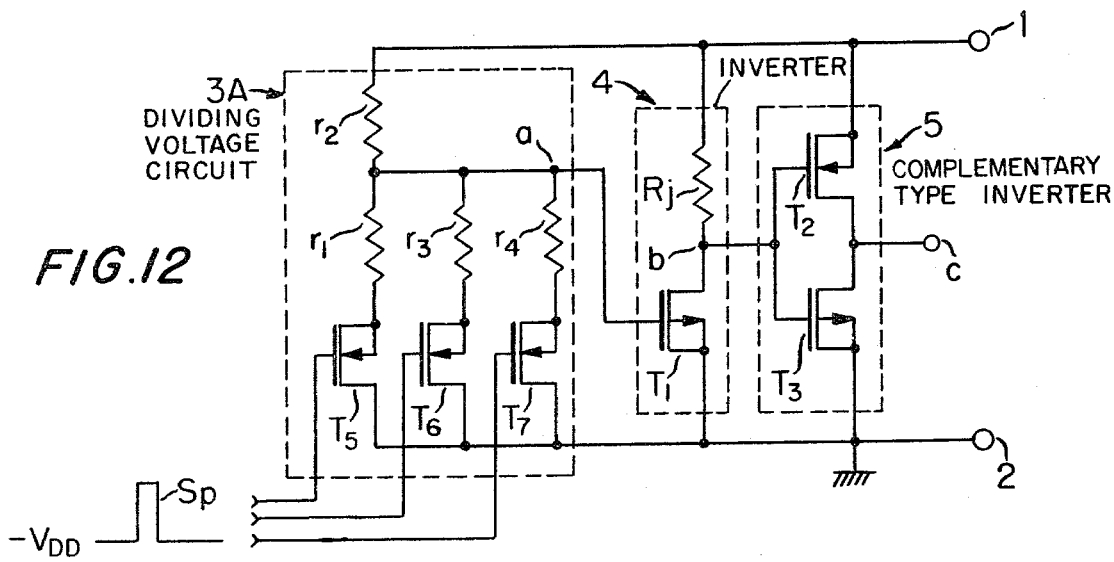

FIG. 12 is a circuit diagram showing another voltage detecting circuit in accordance with this invention. The circuit shown in FIG. 12 comprises an inverter 4 and a complementary type inverter 5 which are the same as the corresponding components of the voltage detecting circuit shown in FIG. 10 and are designated by the same reference numerals. However, in place of the voltage dividing circuit 3 of the voltage detecting circuit of FIG. 10, the embodiment of FIG. 12 uses a different voltage dividing circuit 3A.

As will be seen from FIG. 12, the voltage dividing circuit 3A comprises resistors $r_1$ and $r_2$ connected in series with an N channel MOS transistor N-MOS $T_5$ between the lead lines $l_1$ and $l_2$. A point intermediate the resistors $r_1$ and $r_2$ is connected to a point a. A further N channel MOS transistor N-MOS $T_6$ is connected in series with a resistor $r_3$ between the lead line $l_2$ and point a. Still another N channel MOS transistor N-MOS $T_7$ is connected in series with a resister $r_4$ between the lead line 2 and the point a. A signal pulse SP is supplied selectively to the gates of the transistors N-MOS $T_5$, N-MOS $T_6$ and N-MOS $T_7$ from a suitable source for example one of the stages of the frequency divider of an electronic timepiece.

In the case that the sampling pulse SP is applied to the gate of the N-MOS $T_5$, the dividing voltage corresponding to the ratio of the dividing resistor $r_1$ to the dividing resistor $r_2$ appears to the point a.

In the case that the sampling pulse SP is applied to the gate of the N-MOS $T_6$, the dividing voltage corresponding to the ratio of the dividing resistor $r_3$ to the dividing resistor $r_2$ appears to the point a.

And further, in the case that the sampling pulse SP applies to the gate of the N-MOS $T_7$, the dividing voltage corresponding to the ratio of the dividing resistor $r_4$ to the dividing resistor $r_2$ appears to the point a.

These dividing voltages are applied to the gate of the P-MOS $T_1$.

Namely, the voltage level of the detected voltage $V_j$ is able to vary corresponding to the change of the dividing ratio of the voltage dividing circuit by selecting the sampling pulse so that it applies to one of N-MOS $T_5$, $T_6$, $T_7$ from a suitable source, for example, the frequency divider of an electronic timepiece.

The dividing ratio $\alpha$ of the respective dividing resistor $r_1$, $r_3$ and $r_4$ to the dividing resistor, is determined to make the temperature-coefficient zero depending upon the detecting voltage $V_j$.

The voltage detecting circuit according to the invention has been described with the accompanying drawings. However, this invention is not limited to the illustrated embodiments, and accordingly, modifications and improvements of these embodiments are intended to be included within the scope of the appended claims.

As mentioned above, the voltage detecting circuit according to this invention makes the operating point of the MOS transistor at the time of detecting the voltage point at which the ratio of the current to the conducive constant of the MOS transistor is greater than 0.1. This ratio is much greater than the ratio of the conventional voltage detecting circuit.

Accordingly, the reappearance is in the temperature-characteristic and also the setting of the circuit constant can be readily designed and further the complete temperature-compensation is such that the predetermined voltage is detected despite the variation of the temperature.

And still further, the adjustment of the resistors after fabricating does not need to be done since the detecting voltage coincides with the design value.

Thus, this invention eliminates the conventional defects since the complete temperature compensation is achieved by the change of the ratio of the dividing voltage circuit even if the voltage level of the detecting voltage changes. Besides, the variation of this circuit depending on the variation of the parameters in fabricating the integrated circuit is compensated by modifying the value of the fixed resistor after the transistor for the test measures as the represented value.

What we claim is:

1. A voltage detecting circuit comprising first and second lines connected respectively to terminals of a voltage source of which a predetermined drop in voltage is to be detected, a voltage divider and a first MOS transistor having a gate connected in series with one another between said lines, said voltage divider comprising first and second resistance means connected in series with one another with an intermediate tap between them, first inverter means comprising a second MOS transistor having a gate and third resistance means connected in series with one another between said first and second lines with an output between said second MOS transistor and said third resistance means, means connecting the gate of said second MOS transistor with said tap, second inverter means comprising an N-MOS transistor and a P-MOS transistor each having a gate connected in series with one another between said first and second lines with an output providing a voltage indicating signal between said N-MOS transistor and said P-MOS transistor, means connecting the output of said first inverter means with the gates of said N-MOS transistor and said P-MOS transistor and means for periodically applying a signal pulse to the gate of said first MOS transistor, the ratio of current to the conductive constant of said MOS transistor being above 0.1 whereby said predetermined drop in voltage is determined by the dividing ratio of said voltage divider with compensation for temperature variation.

2. A voltage detecting circuit according to claim 1, comprising at least one additional MOS transistor connected in series with a resistance between said second line and said tap, said additional MOS transistor having a gate and means for selectively applying said pulse to said gate of said additional transistor.

3. A voltage detection circuit comprising:
a logic circuit including a first MISFET of a first conductivity type and a second MISFET of a second conductivity type being opposite to said first conductivity type, wherein the gate electrodes of said first and second MISFETs are commonly connected, the drain electrodes of said first and said second MISFETs are commonly connected to a detection output electrode, and the source electrodes of said first and said second MISFETs are respectively connected to first and second prescribed potentials;
A voltage dividing circuit for applying a divided voltage of a potential difference between said first and said second prescribed potentials to said gate electrodes of said first and said second MISFETs in said logic circuit, including a third MISFET of said second conductivity type and a load resistive element, wherein the source electrode of said third MISFET is connected to said second prescribed potential and the drain electrode of said third MISFET is connected to said first prescribed potential through said load resistive element and is coupled with said gate electrodes of said first and said second MISFETs; and
a bias circuit for applying a bias voltage to the gate electrode of said third MISFET, including first and second linear resistors connected in series between said first and said second prescribed potentials, wherein the juncture of said first and said second linear resistors is connected to the gate electrode of said third MISFET, thus compensating for temperature variations in threshold voltages of said first, second and third MISFETs, in which said bias circuit further includes a fourth MISFET connected in series with said second linear resistor and means for periodically applying a signal pulse to the gate of said fourth MISFET.

* * * * *